(12) United States Patent
Hirose et al.

(10) Patent No.: US 8,129,680 B2
(45) Date of Patent: Mar. 6, 2012

(54) CHARGED PARTICLE BEAM APPARATUS INCLUDING ABERRATION CORRECTOR

(75) Inventors: Kotoko Hirose, Abiko (JP); Takeshi Kawasaki, Musashino (JP); Tomonori Nakano, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 359 days.

(21) Appl. No.: 12/367,811

(22) Filed: Feb. 9, 2009

(65) Prior Publication Data

US 2009/0212228 A1    Aug. 27, 2009

(30) Foreign Application Priority Data

Feb. 22, 2008    (JP) .................. 2008-040815

(51) Int. Cl.
*G01N 23/225* (2006.01)
(52) U.S. Cl. ........................ 250/307; 250/310
(58) Field of Classification Search .......... 250/306–311
See application file for complete search history.

(56) References Cited

U.S. PATENT DOCUMENTS

| | | | | |
|---|---|---|---|---|
| 6,979,820 B2 * | 12/2005 | Ke et al. | | 250/307 |
| 2003/0001102 A1 | 1/2003 | Zach | | |
| 2005/0189496 A1 * | 9/2005 | Uno | | 250/396 R |
| 2006/0060781 A1 * | 3/2006 | Watanabe et al. | | 250/310 |

FOREIGN PATENT DOCUMENTS

| | | |
|---|---|---|
| JP | 2003-521801 | 7/2003 |
| JP | 2005-183086 | 7/2005 |

OTHER PUBLICATIONS

Typke, D. and Dierksen, K. "Determination of Image Aberrations in High-Resolution Electron Microscopy Using Diffractogram and Cross-Correlation Methods", Optik 99, No. 4 (1995), 155-166.*
Steinecker, A. and Mader, W. "Measurement of Lens Aberrations By Means of Image Displacements in Beam-Tilt Series", Ultramicroscopy 81 (2000), 149-161.*
International Journal for Light and Electron Optics, ISSN 0030-4026, 1995, vol. 99.
"Measurement of Lens Aberrations By Means of Image Displacements in Beam-tilt Series" by Steinecker, et al, Ultramicroscopy 81 (2000), 149-161.

* cited by examiner

*Primary Examiner* — Jack Berman
*Assistant Examiner* — David E Smith
(74) *Attorney, Agent, or Firm* — Mattingly & Malur, PC (57) ABSTRACT

A focused charged particle beam apparatus including an aberration corrector, capable of finding the absolute value of the aberration coefficient at high speed, and capable of making high-accuracy adjustments at high speed. A deflection coil tilts the input beam relative to the object point, and measures the defocus data and aberration quantity at high speed while the beam is tilted from one image, and perform least squares fitting on these results to find the absolute value of the aberration coefficient prior to tilting the beam, and to adjust the aberration corrector.

12 Claims, 10 Drawing Sheets

CHARGED PARTICLE BEAM APPARATUS INCLUDING ABERRATION CORRECTOR

CLAIM OF PRIORITY

The present application claims priority from Japanese patent application JP 2008-040815 filed on Feb. 22, 2008, the content of which is hereby incorporated by reference into this application.

FIELD OF THE INVENTION

The present invention relates to a charged particle beam apparatus including an aberration corrector, and relates in particular to an automatic adjustment method for scanning electron microscopes (SEM) and scanning transmission electron microscopes (STEM). This invention also relates in particular to automatic adjustment of scanning charged particle beam apparatuses containing high-order aberration correctors capable of compensating for so-called high-order aberrations such as third-order and fifth-order aberrations.

BACKGROUND OF THE INVENTION

Devices using focused charged particle beams (probe beams) such as scanning electron microscopes (SEM) and focused ion beam (FIB) irradiate a probe beam onto the specimen to make image observations and machine the specimen. Here, the size of the probe cross-section (probe diameter) determines the resolution and machining precision of these charged particle beam apparatuses and basically, the smaller the probe cross section, the higher the resolution and machining precision. Progress has been made in recent years toward developing aberration correctors for focused charged particle beam apparatuses that are now reaching the practical application stage. The aberration corrector utilizes a multi-electrode lens to apply a magnetic field and a non-rotationally symmetrical magnetic field to the beam to give the probe beam an inverse aberration. The aberration corrector in this way cancels out different types of aberrations (or aberrations) such as chromatic aberrations or spherical aberrations generated by the objective lens or deflector lens in the optical system.

Optical systems in devices such as focused charged particle beams of the related art use a rotationally symmetric axial lens. Essentially, the probe diameter can be adjusted to a super-small value by aligning each lens axis and axial aperture, and adjusting the focus and aberration. To adjust the focus and correct the aberration, the probe image was acquired under the condition that the focus was changed and adjustment made by selecting the location with the highest degree of sharpness while comparing the degree of sharpness in the image in at least two dimensions. On the other hand, in devices using focused charged particle beams including aberration correctors, a magnetic field and non-rotationally symmetrical magnetic field were applied by an aberration corrector using a multi-electrode lens. So even though higher-order aberrations do not affect rotationally symmetrical optical systems in the related art, these higher-order aberrations do exert a drastic effect on focused charged particle beam apparatuses. Extracting the maximum possible level of device performance requires accurately measuring the type (aberration component) of aberrations in the beam as well as these higher-order aberrations and the quantity of each aberration component and then removing all aberration components by adjusting the aberration corrector as needed.

Directly observing the cross sectional shape of the probe in focused charged particle beam apparatuses such as SEM and FIB that use probe beams is impossible. A method of the known art therefore extracts information on the probe shape by processing the image in a state where the image from the specimen contains the aberration. The type and quantity of aberration is then found by identifying discrepancies for example in the size, contour, and luminance of a probe shape that contains no aberrations.

In a method for extracting the probe shape as disclosed in JP-T-2003-521801 laid open (patent document 1), specimen structural information is deleted by dividing out the specimen image while underfocused (state where beam converges rearward of specimen) or overfocused (state where beam converges forward of specimen) in the Fourier space from the specimen image while exactly focused (beam is focused on specimen material) to in this way obtain the probe shape. In this method, the probe is gradually made visual while amplifying the aberration component information contained in the probe by shifting the focus. The method in JP-A-2005-183086 laid open (patent document 2) discloses in detail a method for setting the aberration type and quantity from the shape of the probe obtained by the above described technique. The probe shape is in this way found in the underfocus and overfocus states, multiple lines are drawn at equiangular gaps from the median point of the probe shape just obtained, and the line profile information is extracted. Unique quantities expressing the line profile width, bilateral asymmetry, and irregularities (concavities/protrusions) near the center are then found. These unique quantities are next changed by way of the line angles and focus states such as under-focus and over-focus when aberrations are present, and defined as parameters expressing geometrical aberrations and parasitic aberrations (defocus, first-to-third order aberrations, coma, spherical surfaces, frames, stars) up to third-order aberrations where the unique quantities are set as variables for and these quantities are utilized as guides for expressing different aberrations.

In transmission electron microscopes (TEM) on the other hand, an image called a diffractogram is obtained by making Fourier transforms of the amorphous specimen image using an electron beam whose input angle was tilted away from the objective lens optical axis. The diffractogram shape reveals effects from the aberration and so has long been used in attempts to find the aberration coefficient by utilizing the diffractogram image interaction.

A method for example in Ultramicroscopy 81 (2000), pp. 149-161 is disclosed that finds the aberration coefficient by measuring the size of the defocus and aberration from the sloping beam diffractogram and solving the inverse problem. A method is disclosed in Optik 99 (1995) pp. 155-166 for finding the aberration coefficient by calculating the amount of image movement via the beam tilt by calculating the interaction of two images captured under different beam tilt conditions, and solving the inverse problem.

SUMMARY OF THE INVENTION

The values obtained from methods disclosed in JP-T-2003-521801 and JP-T-2005-183086 for calculating the aberration from underfocus and overfocus probe shapes, express quantities that serve as a guide for showing the relative size of aberrations and are not the aberration coefficients that are defined for wave optics and geometrical objects. So using values from these methods as logical values for an aberration or as comparisons for verifying documents or other devices is impossible. These values are also not usable for making absolute evaluations of accuracy so there is a limit to how far that the accuracy of the compensator/corrector can be adjusted. Moreover, these methods also have the problem that another calculation technique must be used to find the aberration coefficient value after correcting the aberration.

Unlike transmission electron microscopes (TEM), scanning charged particle beam apparatuses cannot acquire diffractograms and so must identify the aberration information from just the specimen image. Scanning charged particle beam apparatuses operate by focusing and irradiating a charged electron beam onto the specimen, and aberration information that the image contains is also focused. So scanning charged particle beam apparatuses, unlike diffractograms cannot determine the size of the aberration from one image. Techniques relying on a tilted beam such as utilized in conventional TEM are therefore difficult to apply to scanning charged particle beam apparatuses.

In view of the above problems with the related art, this invention has the object of providing a focused charged particle beam apparatus capable of finding the aberration coefficient absolute value, and using this aberration coefficient to make high precision aberration corrector adjustments.

This invention scans a charged particle beam tilted along the measurement specimen or the scanning surface of the specimen and acquires the secondary charged particle signal, sets the defocus data and aberration quantity of the tilt from the secondary intensity distribution information of the secondary charged particle signal that was obtained and, finds the aberration coefficient from the obtained defocus data and aberration quantities. The aberration coefficient obtained here is then utilized to adjust the aberration corrector.

The method for calculating the aberration coefficient as described above utilizes two basic principles. A first principle is that aberrations increase the change in the optical path differential due to the beam tilt. A second principle is that the extent to which the aberration changes due to the beam tilt is dependent on the extent of original aberration present in the beam tilt conditions and the beam irradiation system. In other words, the technique for calculating the aberration coefficient of this invention is characterized in measuring the defocus data and aberration quantity tilt condition dependence and, inversely calculating the aberration coefficient from the measured dependence in a non-tilt state. The "tilt conditions" for tilt condition dependence are here expressed by the azimuth and tilt angle of the charged particle beam relative to the specified optical axis (i.e. the center axis of the charged particle column and the optical axis of the objective lens, etc.).

This invention can therefore adjust the aberration corrector at high speed by obtaining the absolute value for aberration coefficients in the optical systems of charged particle beam apparatuses.

DETAILED DESCRIPTION OF THE PREFERRED EMBODIMENTS

Principles jointly used in the embodiments as techniques for calculating the aberration coefficient are described next before proceeding with the description of the individual embodiments.

In the technique described in the embodiments for measuring the aberration coefficient, the axis of the input charged particle beam scans the specimen while tilted from the Z-axis and acquires two-dimensional pixel information on the secondary charged particles. The pixel two-dimensional distribution information synchronized with the deflector frequency of the scanning deflector device and arrayed as pixels are the so-called "image". This operation to acquire two-dimensional pixel information and change the tilt azimuth of the input beam is executed multiple times, and two-dimensional distribution information scanned along a different azimuth angle by the primary particle beam is acquired multiple times. Acquiring two-dimensional distribution information by using a tilt beam is physically equivalent to enhancing the aberrations originally contained in the probe beam. The beam input along the optical axis is in a state where all aberrations overlap on the optical system, and extracting a specified aberration quantity at this point is impossible. However, tilting this beam makes the different aberration components appear at distinctly different frequencies according to the tilt azimuth. The multiple aberration components can therefore be easily identified and their aberration quantities found after tracing changes in the image by capturing images of the sloping beam at different azimuth angles.

The defocus data and astigmatic difference contained in each of the two-dimensional distribution information obtained above are next found. The "defocus data" described here signifies the difference in focus positions between the in-focus state and the defocus state. The "astigmatic difference" signifies the difference in focal point distances in two intersecting directions along the optical axis of the charged particle beam.

Measuring the defocus data and astigmatic quantity at each azimuth angle, while changing the azimuth bearing, yields a data string for these defocus data items and astigmatic quantities. An absolute value for the aberration coefficient can be calculated by substituting this data string into a formula expressing the defocus and aberration during the beam tilt, and then performing least squares fitting.

Irradiating the beam onto the object point in a state where possessing a fixed tilt angle, generates an optical path discrepancy in the electron beam due to the beam tilt, and this beam tilt adds the aberration to the specimen image. Setting a function to express this optical path discrepancy due to the aberration as $\chi(\omega)$, usually allows $\chi(\omega)$ to analytically express the discrepancy by using multiple order aberration coefficients. Here, writing $\chi(\omega)$ up to a third order aberration coefficient is expressed in the following formula (Formula 1).

$$\chi(\omega) = \text{Re}\left\{\frac{1}{2}\omega\overline{\omega}C_1 + \frac{1}{2}\overline{\omega}^2 A_1 + \omega^2\overline{\omega}B_2 + \right.$$
$$\left.\frac{1}{3}\overline{\omega}^3 A_2 + \frac{1}{4}\omega^2\overline{\omega}^2 C_3 + \omega^3\overline{\omega}S_3 + \frac{1}{4}\overline{\omega}^4 A_3 + \ldots\right\}$$ Formula 1

In Formula 1, C1, A1, B2, A2, C3, S3, A3 respectively denote the defocus, two-fold astigmatism, axial comatic aberration, three-fold astigmatism, third order spherical aberration, star aberration, and four-fold astigmatism. Also, $\omega$ denotes the complex coordinates on the object plane. Here, tilting the input electron beam along a tilt angle $\tau$ allows writing $\chi(\omega)$ as shown next. The tilt angle $\tau$ is here expressed in complex coordinates.

$$\chi(\omega + \tau) =$$ Formula 2
$$\text{Re}\left\{\frac{1}{2}\omega\overline{\omega}C_1(\tau) + \frac{1}{2}\overline{\omega}^2 A_1(\tau) + \omega^2\overline{\omega}B_2(\tau) + \frac{1}{3}\overline{\omega}^3 A_2(\tau) + \right.$$
$$\left.\frac{1}{4}\omega^2\overline{\omega}^2 C_3(\tau) + \omega^3\overline{\omega}S_3(\tau) + \frac{1}{4}\overline{\omega}^4 A_3(\tau) + \ldots\right\}$$

In Formula 2, C1 ($\tau$), A1 ($\tau$), ..., respectively express the aberration coefficients when the electron beam is tilted.

Each aberration coefficient during beam tilt is expressed by the sum of the electron beam tilt angle $\tau$, and the aberration coefficient when there is no beam tilt. Considering for example aberration coefficients up to third-order, the defocus (C1($\tau$)) expressed via the tilt will be as shown below.

$$C_1(\tau) = Re[C_1 + 2C_3\tau\overline{\tau} + 4B_2\tau + 6S_3\overline{\tau}]$$ Formula 3

Likewise, the dual symmetrical astigmatism (A1($\tau$)) expressed via the tilt becomes as follows.

$$A_1(\tau) = A_1 + 2A_2\overline{\tau} + 2\overline{B}_2\tau + C_3\tau^2 + 6\overline{S}_3\tau\overline{\tau} + 3A_3\overline{\tau}^2$$ Formula 4

The C1($\tau$) and A1($\tau$) contain all aberration coefficients in non-tilt beam optical system up to third-order as shown in Formula 3 and Formula 4. If even higher order aberration coefficients are included here in Formula 1, then $\chi(\omega)$ can be utilized as a polynomial at any desired order for $\omega$.

Moreover, even when $\chi(\omega)$ is expressed in polynomial form at a desired order, C1($\tau$) and A1($\tau$) will of course be expressed in a form containing the aberration coefficient at the desired order prior to sloping the beam. In other words, all aberration coefficients for a desired order can be found if the function for C1($\tau$) and A1($\tau$) and their coefficient are known.

Next, when expressing the direction that the input beam is irradiated as complex notation, the tilt angle t for the lens optical axis and the azimuth angle $\phi$ on the lens surface can express $\tau$ as shown below:

$$\tau = te^{i\phi}$$

Adjusting by substituting this into Formula 3, finally allows writing the following formula in the format used by Formula 3 and 4.

$$\sum_{k=0}^{n} m_k(t)e^{ik\phi}$$ Formula 5

Here, $m_k(t)$ is a coefficient expressed in a formula made up of each aberration in non-tilt beam optical system and the linear coupling of t. The $m_k(t)$ (Formula 5) can be found by measuring the C1($\tau$) and A1($\tau$) for several azimuth angles $\phi$ at a particular tilt angle t and performing least squares fitting.

Figure 1:
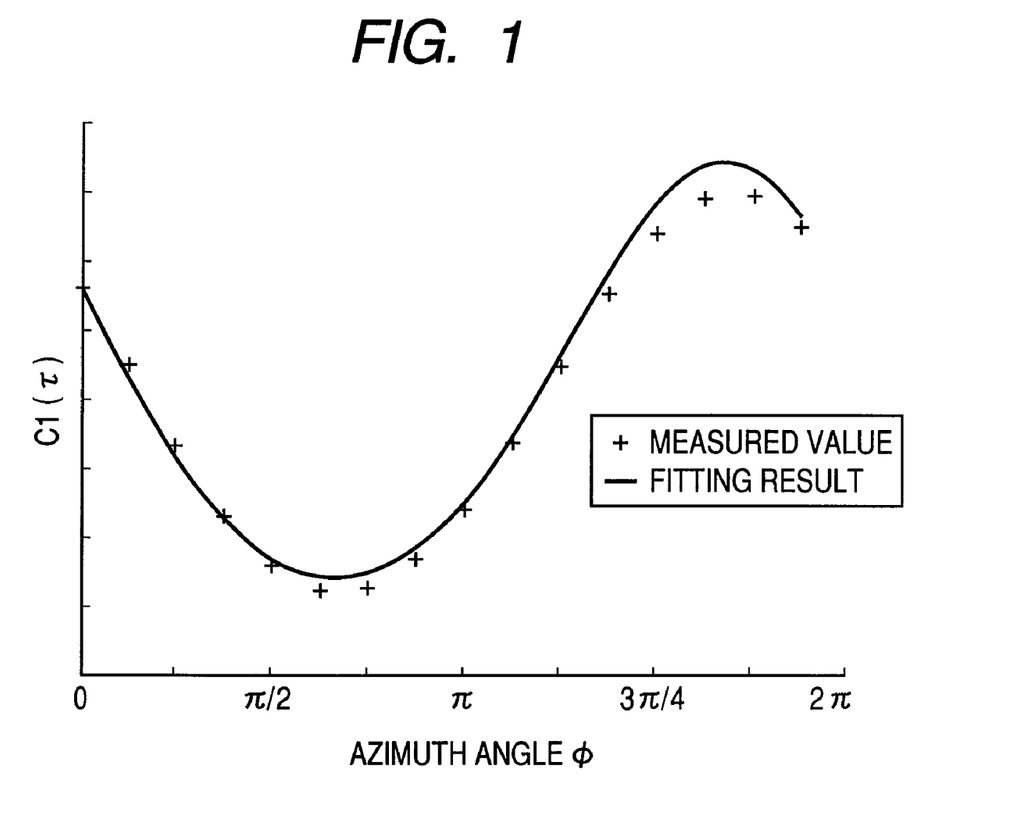
FIG. 1 is a graph showing the least squares fitting and the Cl (τ) measurement value for finding the aberration coefficient.

FIG. 1 shows an example of this least squares fitting for C1($\tau$). Then substituting $\tau = te^{i\phi}$ into Formula 3 yields the following expression.

$$C_1(t,\phi) = Re[(C_1 + 2C_3 t^2) + 4B_2 te^{i\phi} + 6S_3 t^2 e^{2i\phi}]$$ Formula 6

When $e^{i\phi} = \cos\phi + i\sin\phi$ is substituted in here, the Formula 3 finally becomes the following.

$$C_1(t,\phi) = (C_1 + 2C_3 t^2) + 4\text{Re}B_2 t\cos\phi -$$ Formula 7
$$4\text{Im}B_2 t\sin\phi + 6\text{Re}S_3 t^2 \cos 2\phi - 6\text{Im}S_3 t^2 \sin 2\phi$$

Therefore, measuring the value for C1 (t, $\phi$) while varying $\phi$ at a certain fixed value t, and using the value thus obtained for least squares fitting in(of Formula 7, allows finding values for (C1+2C3t2), ReB2, ImB2, ReS3, ImS3 from each term of the coefficient. Moreover, the value for C3 can be found from the (C1+2C3t2) value by measuring the C1 value beforehand while there is no beam tilt (beam is not tilted). The aberration coefficients in the non-tilt beam optical system can in this way be found from the values measured for C1(t, ( ) while the beam is tilted.

The same calculation can also be made for A1(t, ( ). Here, A1(t, ( ) contains terms relating to A2, A3 that do not appear in the C1(t, ( ) form, so A2, A3 can be found for the first time by checking A1(t, ( ). All the aberration coefficients in the non-tilt beam optical system can be found by measuring the A1(t, ( ) and C1(t, ( ) values in this way.

All aberration coefficients in the non-tilt beam optical system can be found by simultaneously solving for the $m_k(t)$ that was obtained.

The aberration coefficients calculated in the above steps are then used to calculate the aberration corrector (aberration compensator) correction quantity and in this way make the aberration corrector adjustment.

Applying the technique as described in these embodiments to scanning charge particle beam devices that scan an object with a charged particle beam and acquire image information, allows calculating the aberration coefficient with higher accuracy than in the related art. Moreover, the aberration compensator (aberration corrector) adjustment can be made with higher accuracy than the related art. The technique described in these embodiments is effective on scanning electron microscopes (SEM), scanning transmission electron microscopes (STEM) and also on focused ion beam (FIB) devices.

First Embodiment

This embodiment describes in detail a scanning electron microscope (SEM) containing a four to eight electrode for an electrical field gravimetric aberration corrector. The aberration corrector described in this embodiment contains multiple stages of multi-electrode lenses and is capable of correcting higher-order aberrations. The scanning electron microscope of this embodiment is characterized in using a standard specimen formed with steps to acquire the SEM image and then utilizing the SEM image from that standard specimen to calculate the aberration coefficient.

Figure 2:
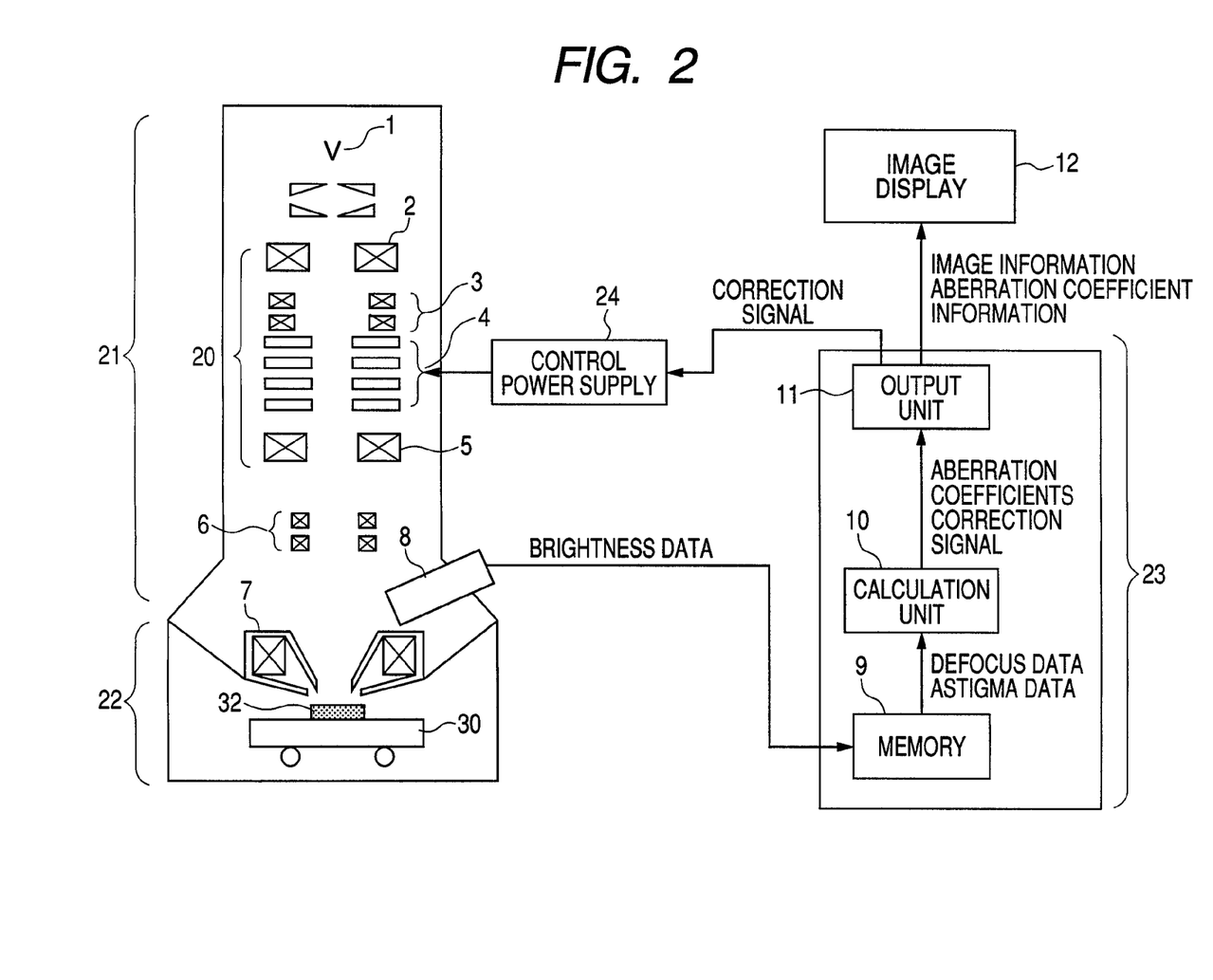
FIG. 2 is a block diagram showing the device of the first embodiment.

FIG. 2 shows a block diagram concept view of the system structure of the SEM of the present embodiment. The SEM shown in FIG. 2 includes a specimen chamber 22 containing a specimen stage 30 for holding the specimen 32; an electron optical column 21 to irradiate an electron beam onto the specimen 32 and, including a function to detect the emitted secondary electrons or reflected electrons and output a signal containing the detected results; a control power supply 24 for regulating the electrical current and voltage supplied to each component of the electron optical column; an data processing device 23 for processing the signals that were output and performing different types of processing; and an image display 12 for displaying image data that was processed by the data processing device 23. The interior of the electron optical column 21 and the specimen chamber 22 are maintained at a high vacuum during device operation. Electrons emitted from an electron gun 1 pass through a first condenser lens 2 and a deflection coil 3 and are input to an aberration corrector 4. In this embodiment, the aberration correction system 20 is made up of a first condenser lens 2 of aberration corrector 4, the deflection coil 3, and the second condenser lens 5.

This aberration correction system 20 includes the first condenser lens 2 to guide the electron beam along a track parallel to the aberration corrector 4, the deflection coil 3 that functions to tilt the input beam used for aberration measurement relative to the optical axis, the aberration corrector 4 to actually correct the aberration (aberration), and the second condenser lens 5 for forming a crossover of electrons emitted from aberration corrector 4 at a suitable position above the objective lens 7.

The operation of the multiple electrodes that together make up the aberration corrector 4 and the track of the electron beam passing inside these multiple electrodes are described next. The aberration corrector 4 is made up of a four-stage multi-electrode electron lens mounted along the optical axis. A static four-electrode field and an eight-electrode field are overlapped in the first and the fourth stages of the multi-electrode lens. A static four-electrode field and magnetic four-electrode field are overlapped in the second and third stages. The electron beam track passing along the optical axis can in this way be independently changed in the X and Y directions by adjusting each stage of these electrical and magnetic fields. Aberrations (aberrations) in the electron beam passing through the interior of the aberration corrector can be corrected in an operation where: the first stage electrostatic multi-electrode field isolates the input electron beam along an X track and a Y track and, the second and third stages separately eliminate aberrations along the X track and Y track (more accurately, the structural elements of electron optical column 21 such as the objective lens 7 generate an inverse aberration), and the fourth stage returns the isolated tracks to the original state.

The SEM of this embodiment includes a mechanism that tilts the beam input onto the object point of the objective lens, relative to the optical axis of the objective lens. The SEM of this embodiment for example contains a second stage deflector 3 in the upper part of the aberration corrector. This second stage deflector 3 forms a beam whose center axis is a certain tilt angle and azimuth angle relative to the optical axis of objective lens 7. The memory 9 stores information regarding the beam azimuth angle and tilt angle. This information is checked at times such as when acquiring image data and calculating the aberration coefficients.

The second condenser lens 5 passes along and shrinks the electron beam that passed through the aberration corrector 4. A scan coil 6 scans the electron beam that passed through the second condenser lens 5 and irradiates the electron beam via the objective lens 7 onto a specimen 32 mounted on a specimen stage 30. Secondary charged particles such as secondary electrons and reflected electrons emitted from the specimen 32 are detected by a secondary electron detector 8 as secondary charged particle signals, output from the electron optical column 21 as brightness distribution type image data to the data processing device 23, and finally are stored in memory 9.

A computing unit 10 inside the data processing device 23 uses the received image data to calculate the aberration coefficients for each aberration/aberration remaining on the optical system. After calculating the aberration coefficients, the amount of electrical current needed by the corrector to handle this aberration is calculated, and the correction signal is then calculated by finding the difference versus the electrical current or electrical voltage values currently being applied to the multi-electrode lens of aberration corrector 4. This correction signal is forwarded to the control power supply 24 by way of an output unit 11, and is consequently fed back to the SEM side of aberration corrector 4. The image display 12 outputs the specimen image data and information on the calculated aberration coefficient.

Figure 3:
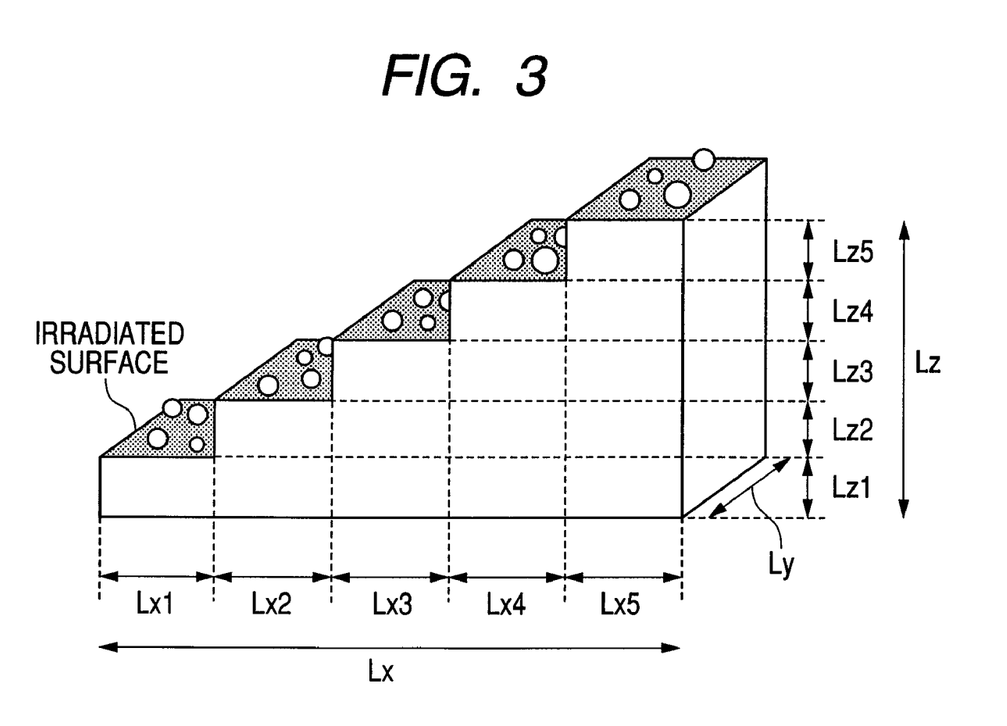
FIG. 3 is a graph drawing showing the step-shaped standard specimen.

The SEM of this embodiment utilizes a standard specimen on which steps are formed as shown in FIG. 3 in order to acquire images in one batch for setting the defocus data and aberration quantity. The standard specimen shown in FIG. 3 is a structure with a flat plane of lengths Lx1 through Lx5, and a width Ly; on a step-shaped specimen stand in steps Lz1 through Lz5. This flat plane forms the beam irradiation surface where the beam is irradiated, and on which spherical specimens such as hole patterns and metal vapor particles are mounted. Information on the lengths Lx1-Lx5, width Ly and further the steps Lz1-Lz5 of the beam irradiation surface is stored in the memory 9. This information is referred to during different types of image processing and when calculating the aberration coefficients.

Figure 4:
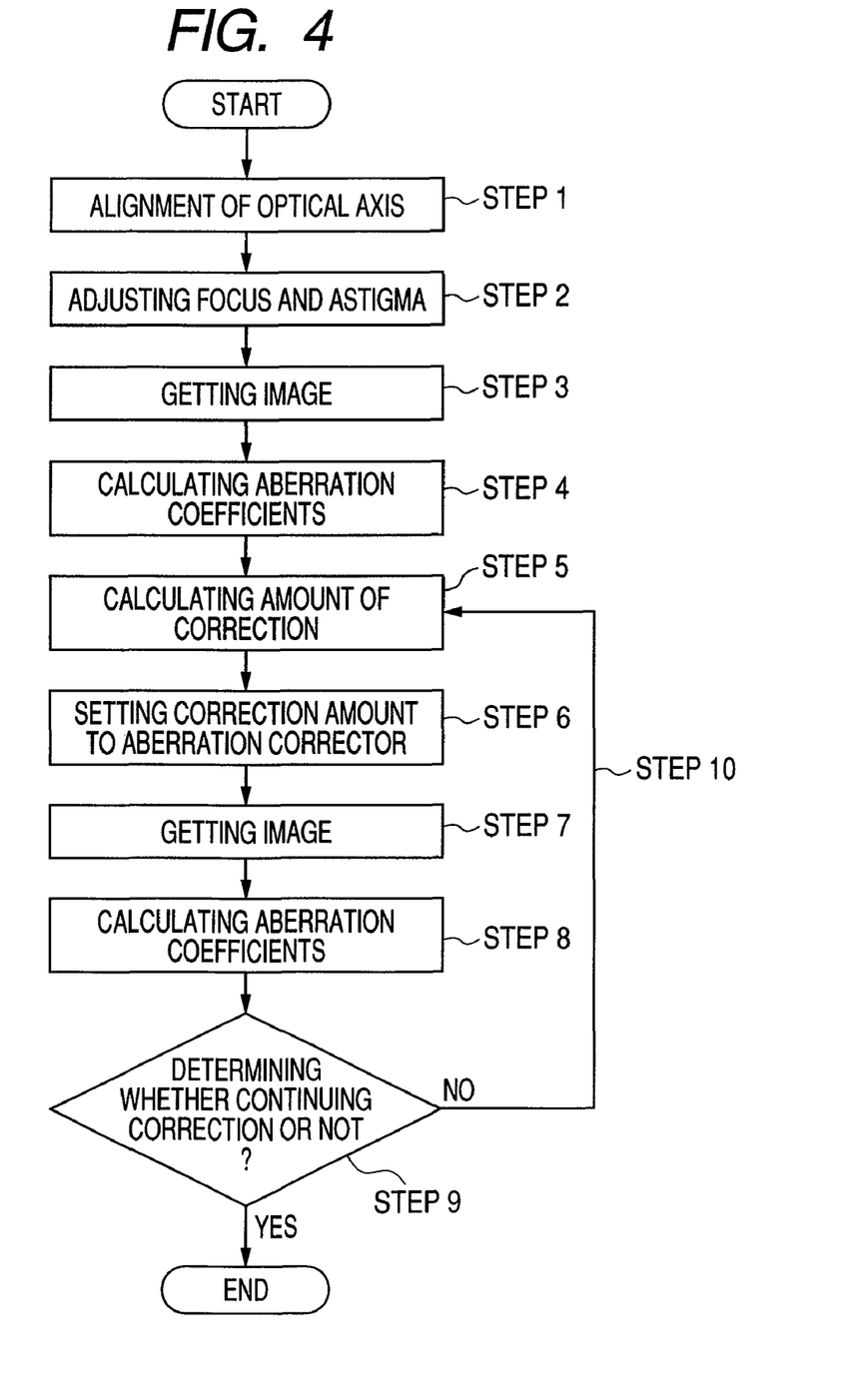
FIG. 4 is a flow chart of the overall operation of the device of the first embodiment.

The sequence used in the SEM of this embodiment when correcting the aberrations is described next while referring to FIG. 4 and FIG. 7. FIG. 4 shows a flow chart of the entire process of this embodiment.

As part of the setup, the stage is shifted and the standard specimen utilized for the focus alignment and aberration adjustment is scanned and the usual optical axis alignment (STEP1), focus alignment and astigma adjustment (STEP2) are performed. During the focus alignment and astigma adjustment in STEP2, the vicinity of center of a stair for the standard specimen shown in FIG. 3 is set as the referential stair, and the equipment is adjusted in a state where the astigma had been corrected and the focus was aligned relative to the specimen on the referential stair. The control power supply 24 executes these focus alignments and astigma adjustments based on step information Lz stored in the memory 9, and specimen height information from the specimen height measurement unit not shown in the drawing in FIG. 2. The standard specimen images are next acquired in this state (STEP3). When acquiring the reference image, the scanning range of the electron beam is set to the length Lx and width Ly, images of the standard specimen surface irradiated by the beam are acquired together and, an image data (pixel distribution data) on a surface area equivalent to the beam irradiation region on each step among the batch of acquired images is removed by using the length information Lx1-Lx5 and width information Ly on each step. This removed image data is linked to reference information that matches the number of steps on the beam irradiation surface, and stored in the memory 9. The operation for STEP3 is now complete.

Figure 5:
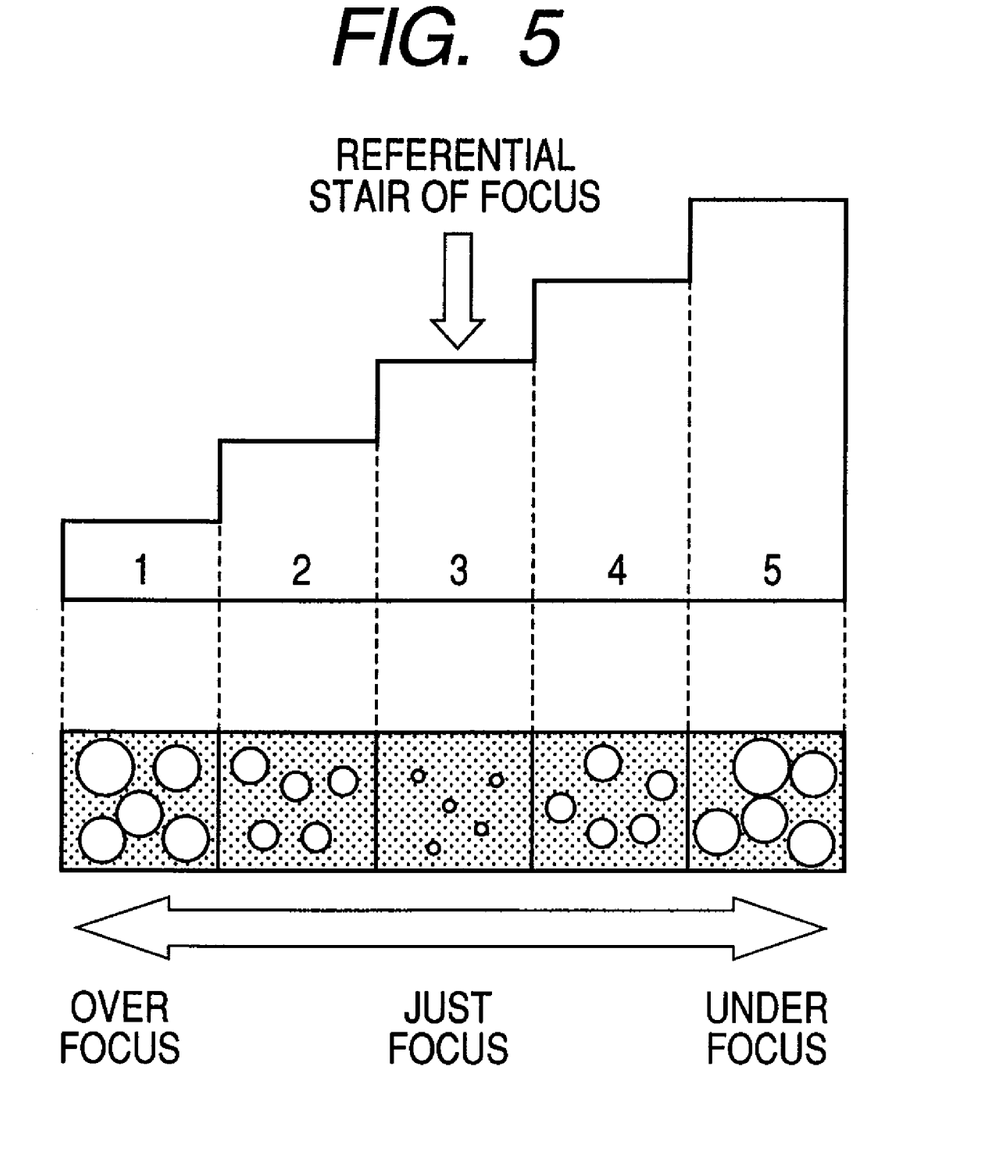
FIG. 5 is a drawing showing an example of the specimen image when the focus was aligned using the stair-shaped specimen stand.

One example of the specimen image (specimen image in a state where focus alignment of the referential stair of the standard specimen is complete) acquired in STEP3 is shown in FIG. 5. To simplify the description, reference numerals 1-5 showing the stairs are assigned to each stair on the specimen. When the focus has been aligned with the referential stair (stair No. 3), the focus is now aligned (just focus state) with the referential stair on the specimen but is in an under-focus state versus the specimen (stairs Nos. 4 and 5) on the side above the referential stair, and in the same way is in over-focus state versus the specimen (stairs Nos. 1 and 2) on the side below the referential stair. The deflection coil 3 is operated in this state to form a tilt beam and, the $C1(\tau)$ and $A1(\tau)$ are measured. The operation up until now has been the setup for calculating the aberration, and the aberration coefficients are actually calculated in STEP4.

Figure 6:
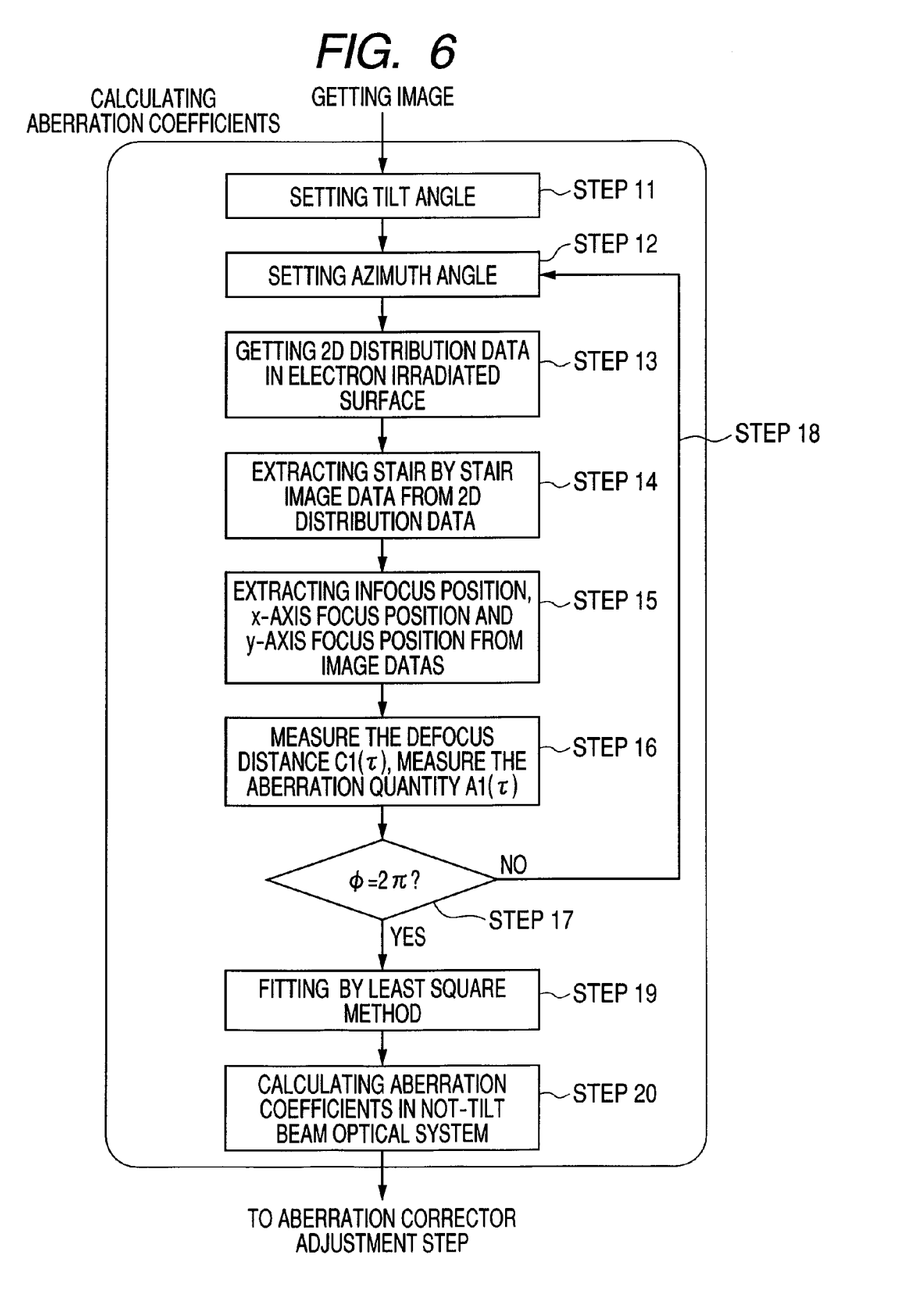
FIG. 6 is a detailed flow chart showing the aberration coefficient measurement flow for the flow chart shown in FIG. 4.

FIG. 6 is a flow chart showing in more detail the aberration coefficient measurement flow for the flow chart of FIG. 4. The deflection coil 3 is adjusted from the above described focused state to input an electron beam having a tilt angle T and an azimuth angle $\phi$ versus the object point (STEPS 11, 12). The range of the tilt angle $\tau$ and azimuth angle $\phi$, and step size of the change in azimuth angle and tilt angle are preset and stored within the memory 9. The data processing device 23 reads out the setting information for $\tau$, $\phi$ stored in the memory and transfers this information to the control power supply 24. The control power supply 24 controls the deflection coil 3 based on the data processing device 23 instructions and irradiates the electron beam onto the specimen at the specified tilt angle and azimuth angle. Images of the irradiated surface on the standard specimen are acquired all together in this state (STEP13), and image data matching the beam irradiation region on each step is extracted from the acquired batch of images (STEP14). The just focus position and the in-focus position at the beam tilt angle $\tau$ are next estimated by image processing the image data for beam irradiation regions on each stair (STEP15). When estimating the just focus position, the length in the X direction and the Y direction for each pattern edge are calculated, and the position of the stair number with the smallest total length sum in the X direction on each pattern is set as the X direction just focus state position, and the position of the stair number with the smallest total length sum in the Y direction on each pattern is set as the Y direction just focus state position. When estimating the in-focus position for example, the step number position on each pattern edge with the smallest difference in lengths in the Y direction and X direction is estimated as the in-focus position. All types of image processing in the above description are implemented by the computing unit 10 in FIG. 2. Besides the above description, various types of algorithms may also be used to decide the just focus state and the in-focus state.

Next, the $C1(\tau)$ and $A1(\tau)$ are measured using the position information (i.e. information expressed by step numbers) that was obtained and the beam irradiation surface length information Lx1-Lx5 as well as the step information Lz1-Lz5 stored in the memory 9 (STEP16).

The method for executing the processing steps in STEP14-STEP16 is described next in detail using FIG. 7. The image processing and arithmetic processing are implemented by the computing unit 10 using software stored in the memory 9 the same as the flow in FIG. 4.

Figure 7:
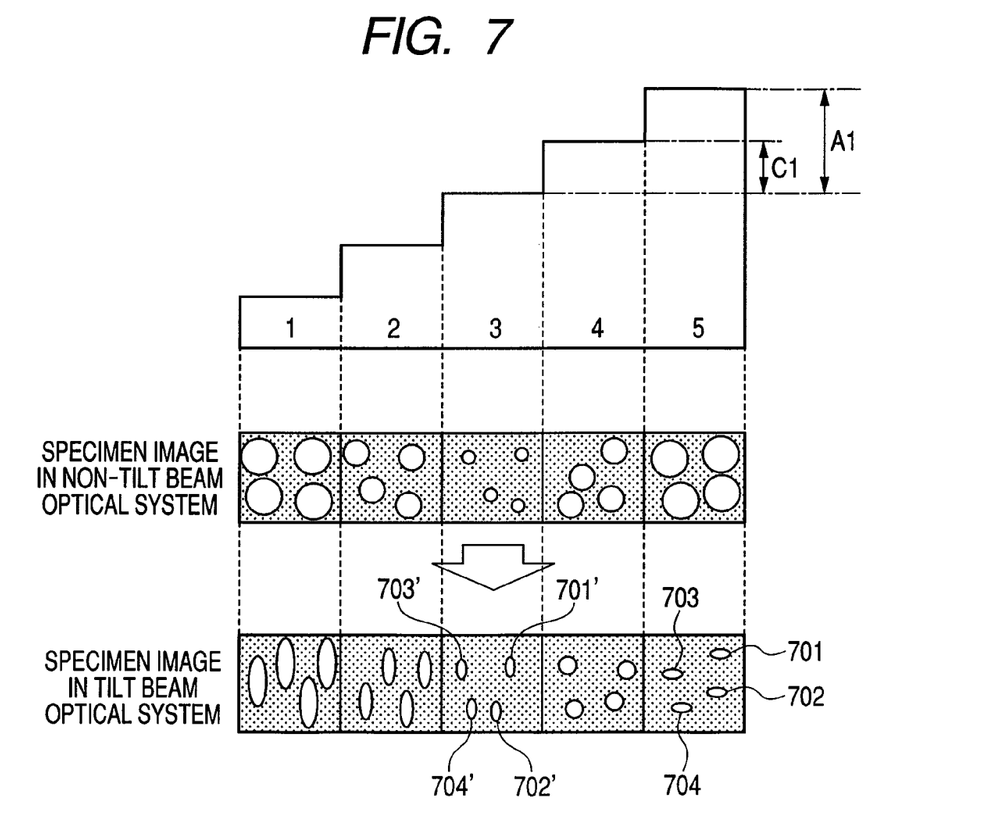
FIG. 7 is a drawing showing the change in the specimen image when the beam was tilted, and the interrelation between the defocus data and the aberration quantity.

FIG. 7 is a drawing showing the change in the specimen image before and after sloping (tilting) the beam, and the interrelation between the defocus and aberration. After beam sloping, the specimen image focus state is changed from that prior to sloping the beam. Moreover the sloping applies an aberration to the beam so that the in-focus position (where the two aberrations are at positions balanced 90 degrees away from each other) is different from the pre-sloping position. In the example shown in FIG. 7, the in-focus position after beam sloping has shifted one step higher from step number 3 to 4 compared to before the beam sloping. Moreover, the aberration appears at the step number 1-3 positions in the Y direction after beam sloping, and the aberration appears in the X direction at the step number 5 position. In FIG. 7, the defocus data is the difference between the height of the step number 4 which is the in-focus state, and the height of step number 3 which is the just focus state (state where beam is tilted) because the defocus data is defined by the difference between the in-focus state position and the just focus state position. The defocus data $C1(\tau)$ when the tilt angle is $\tau$ can therefore be found from each piece of position information on step numbers 3 and 4 and information (step information Lz3) on the difference in height at each position.

The astigmatic difference is defined as the difference in focal point distance in two intersecting directions along the optical axis of the charged particle beam. Therefore the astigmatic difference is regarded as the difference in distances between the step in the X direction where the focus is best aligned, $A1(\tau)$ and the step in the Y direction where the focus is best aligned. In the case shown in FIG. 7, the step number 3 position is the step where the focus is best aligned in the X direction, and the step number 5 position is the step where the focus is best aligned in the Y direction so the aberration quantity $A1(\tau)$ is found as the difference between the heights of step numbers 3 and 5.

Aberrations in the 45 degree direction are set in the same way. More specifically, the line profile may be taken along the 0 degree direction and 45 degree direction of both the reference image and the captured image, and changes in the focus along the line then measured. Here the 0 degrees and 45 degrees define the proper rectangular coordinate system on the acquired image. The 0 and 45 degrees may be set as the reference along the X axis. In the processing for steps 13-16 described above, $C1(\tau)$ and $A1(\tau)$ are measured as one step measurement, and the data for $\phi$, $C1(\tau)$ and $A1(\tau)$ stored in the memory 9.

When STEP16 ends at $0 \leq \phi < 2\pi$, a decision is made on whether $C1(\tau)$, $A1(\tau)$ were measured at all azimuth angles (STEP17). In this embodiment, the range of $\phi$ is set as the range from the initial phase. If the azimuth angle is $2\pi$ at the point in time where step 16 ends, then the step 18 loop terminates and the process shifts to step 19. If the azimuth angle did not reach $2\pi$ then the process returns to step 12, the deflection coil 3 is adjusted, and the azimuth angle $\phi$ is increased just by the track width $\delta\phi$ while maintaining the tilt angle(. The process in steps 13-16 is then repeated for the newly set azimuth angle (+(( and the $C1(( )$, $A1(( )$ are measured (STEPS 13-16).

When finished measuring $C1(( )$, $A1(( )$ for the range of ( and ( set per mk(t), the coefficient of Formula 5 is calculated by least squares fitting (STEP18), the value thus obtained is used to solve for each aberration coefficient (STEP19). All desired aberration coefficients in non-tilt beam optical system can be found in this way.

After using the above process to measure the aberration coefficients contained in the current optical system, the size of the correction signal conveying the aberration coefficients that were obtained to the aberration corrector is set (STEP5), the correction signal is fed back to the aberration corrector, and the aberration is corrected by changing the strength of the aberration corrector field according to the correction signal (STEP6). The post-correction reference image is then captured (STEP7), and the aberration coefficient after correction is measured by using the same technique as shown in FIG. 7 (STEP8). A decision is next made on whether to re-correct according to the actual correction amount obtained via the post-correction coefficients, or to end the process (STEP9).

As already described, utilizing the stair-shaped specimen stand of this embodiment allows measuring the defocus data and aberration quantity from one image, and calculating the aberration coefficient at high speed with few images. The example for this embodiment described using an aberration corrector with four to eight electrodes needless to say however other multi-electrode lens structures may be used in this aberration corrector.

Second Embodiment

The charged particle beam apparatus of this embodiment is a SEM (scanning electron microscope) with the object of setting the defocus data and the astigmatic difference quantity at high speed in the stair-shaped standard specimen by mounting a piezoactuator in the specimen stage.

Figure 8:
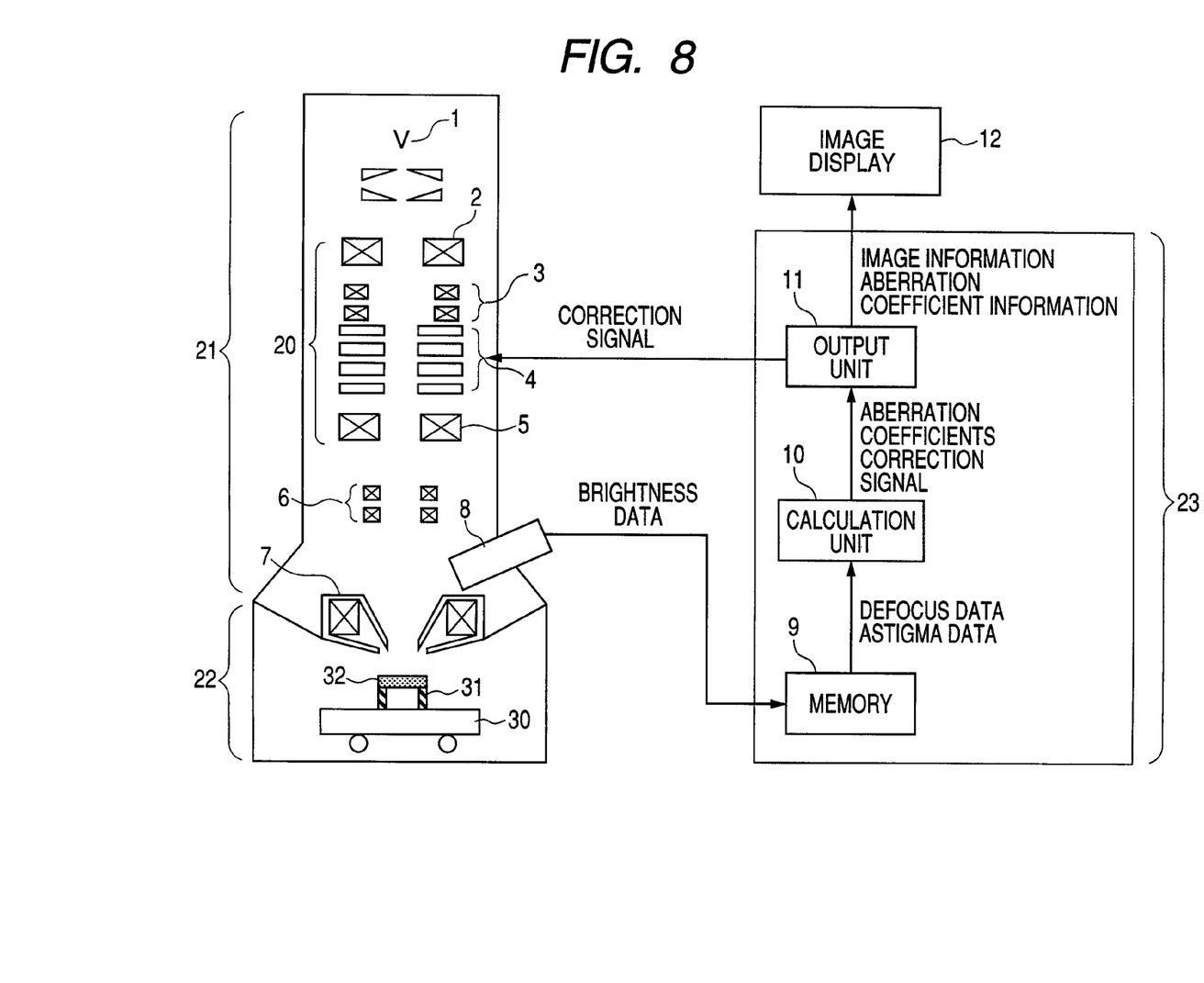
FIG. 8 is a block diagram showing the structure of the device for the second embodiment.

FIG. 8 shows the structure of the device of the second embodiment. A description of sections with the same operation and function as in FIG. 2 is omitted. In FIG. 8, a stage 31 driven in the direction of the device height and utilizing a piezoactuator is mounted in the specimen stage 30. The range of changes in focus due to aberration will change as the aberration correction progresses so that when using a stair-shaped specimen stand, multiple specimen stands of different heights must be prepared so that no focus mismatches will occur regardless of the level on the stair-shaped specimen stand during the aberration correction. However, the stair-shaped specimen stand can be adjusted so that the stand center is always at the in-focus state by changing the height of the stair-shaped specimen stand driven along the device height and using a piezoactuator. Out-of-focus states and aberration quantities can in this way be measured more accurately than when using the step-shaped specimen stand alone.

Third Embodiment

The third embodiment shows the case where this invention is applied to a length-measurement SEM.

Figure 9:
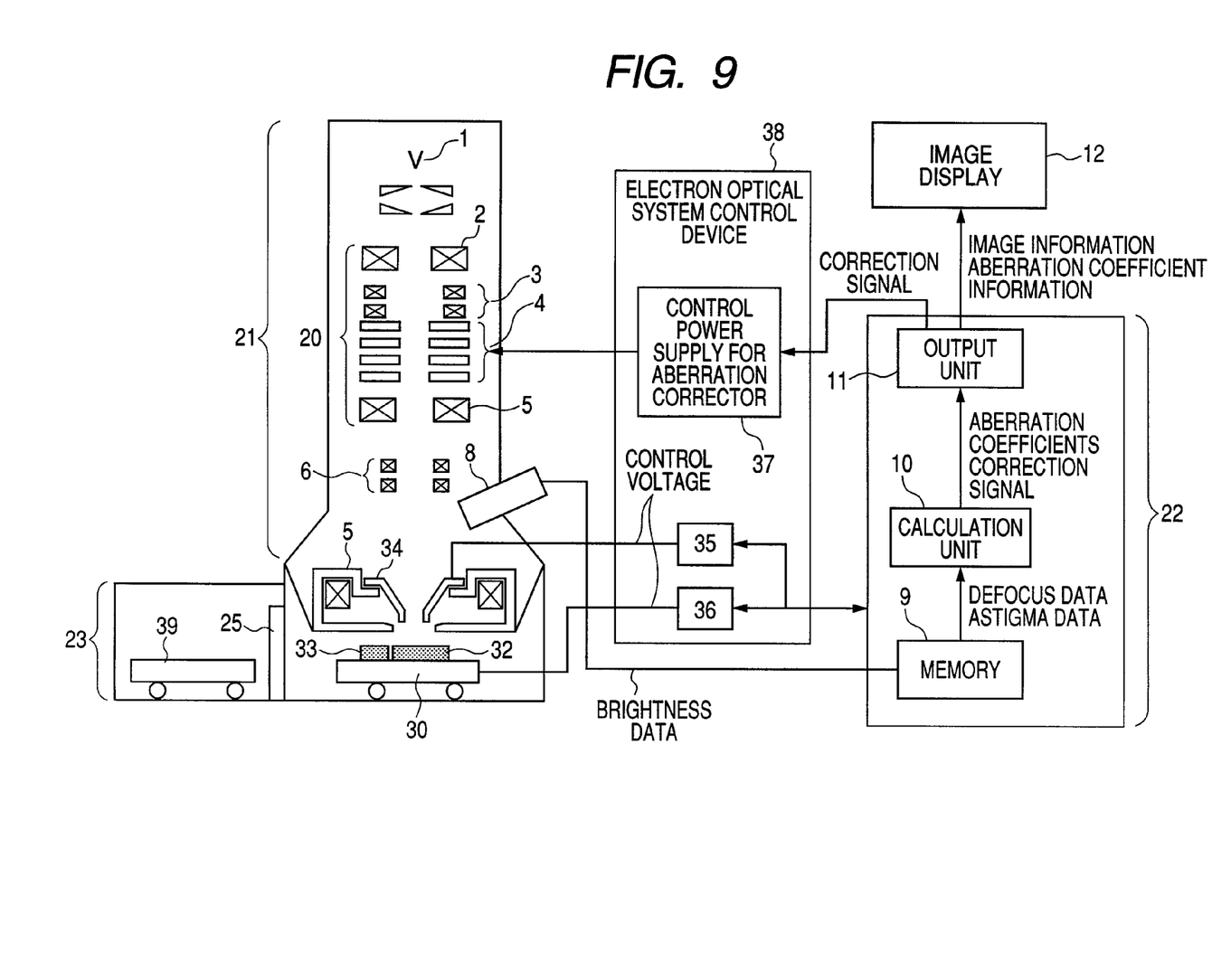
FIG. 9 is a block diagram showing the structure of the device for the third embodiment.

FIG. 9 is a block diagram showing the system structure of the length-measurement SEM of this embodiment. The length-measurement SEM is a device that measures the length between two points on measured image data by making pixel calculations. The length-measurement SEM of this embodiment contains a specimen pre-setup chamber 23 for guiding the specimen into the device, the SEM shown in FIG. 2 contains a specimen chamber including a specimen stage 30 for holding the specimen 32, an electron optical column 21 for irradiating an electron beam onto the specimen 32, and includes a function for detecting the emitted secondary electrons or reflected electrons and outputting the signal detection results, a electron optical system control device 38 to regulate the electron optical column, an data processing device 22 to process the signal that was output and perform different types of arithmetic processing, and an image display 12 to display image data processed by the data processing device 22. However the functions and operation of each component are approximately the same as described in the first embodiment so redundant descriptions are omitted.

A gate valve 25 partitions the specimen chamber in the device main unit and the specimen pre-setup chamber 23. To feed the specimen into the device, the gate valve opens, and a specimen conveyor mechanism 39 feeds the specimen into the specimen chamber on the main device. The device makes adjustments using the standard specimen 33 mounted on the specimen stage 30.

The length-measurement SEM of this embodiment contains a boosting electrode 34 above the magnetic field objective lens 5. Applying an electrical field to this boosting electrode forms an electrostatic lens. Fine adjustments can be made to the focus by changing the strength (intensity) of this electrostatic lens. The voltage applied to the boosting electrode 34 is varied by the controlling the boosting power supply 35 and in this way vary the focus (boosting focus). A voltage (retarding voltage) for forming a decelerating electrical field is applied by the retarding power supply 36 to the input electron beam in the specimen stage 30. However regulating this retarding voltage allows adjusting the focus (retarding focus). The response to excitation current in the magnetic field objective lens is delayed due to magnetic aftereffects so that high speed focus changes can be performed by adjusting the retarding voltage and boosting voltage rather than using the objective lens excitation current.

In contrast to the first and second embodiments where one image is made to hold multiple focus information by applying changes the specimen height, in this embodiment the focus position is changed in the electron beam itself to measure the defocus data so no stepped-shaped specimen such as in FIG. 3 is needed.

The following method may for example be utilized to find $C1(\tau)$, $A1(\tau)$ from the captured image.

First of all, each focus point on the specimen image is captured while varying the electron beam focus by changing the boosting voltage or the retarding voltage.

Next the directional degree of sharpness (directional differential in the sum of squares for 0°, 45°, 90°, 135°) from each captured image is calculated. This directional degree of sharpness forms a function for focus values in each direction.

Setting the respective focus values where the directional degree of sharpness reaches a peak as p0, p45, p90, p135, allows expressing the size $\delta$ and the direction $\alpha$ of aberration $A1(\tau)$ and $C1(\tau)$ by the following formula.

$$\delta^2 = (p0 - p90)^2 + (p45 - p135)^2 \qquad \text{Formula 8}$$

$$\alpha = \frac{1}{2}\tan^{-1}\left(\frac{p45 - p135}{p0 - p90}\right) \qquad \text{Formula 9}$$

$$C1(\tau) = \frac{p0 + p45 + p90 + p135}{4} \qquad \text{Formula 10}$$

In other words, the defocus data is equivalent to the average of the maximum values for the directional differential of squares in the four directions. The astigmatic difference amount can be found by using a trigonometric function to fit the focus position where the differential of the sum of squares in all astigmatic directions is a maximum, and then calculating the difference between the maximum and minimum values obtained from the fitting curve (when the aberration difference is defined by the difference between the minimum and maximum values). Utilizing this method allows simultaneously finding the defocus data and aberration difference in one operation.

Figure 10:
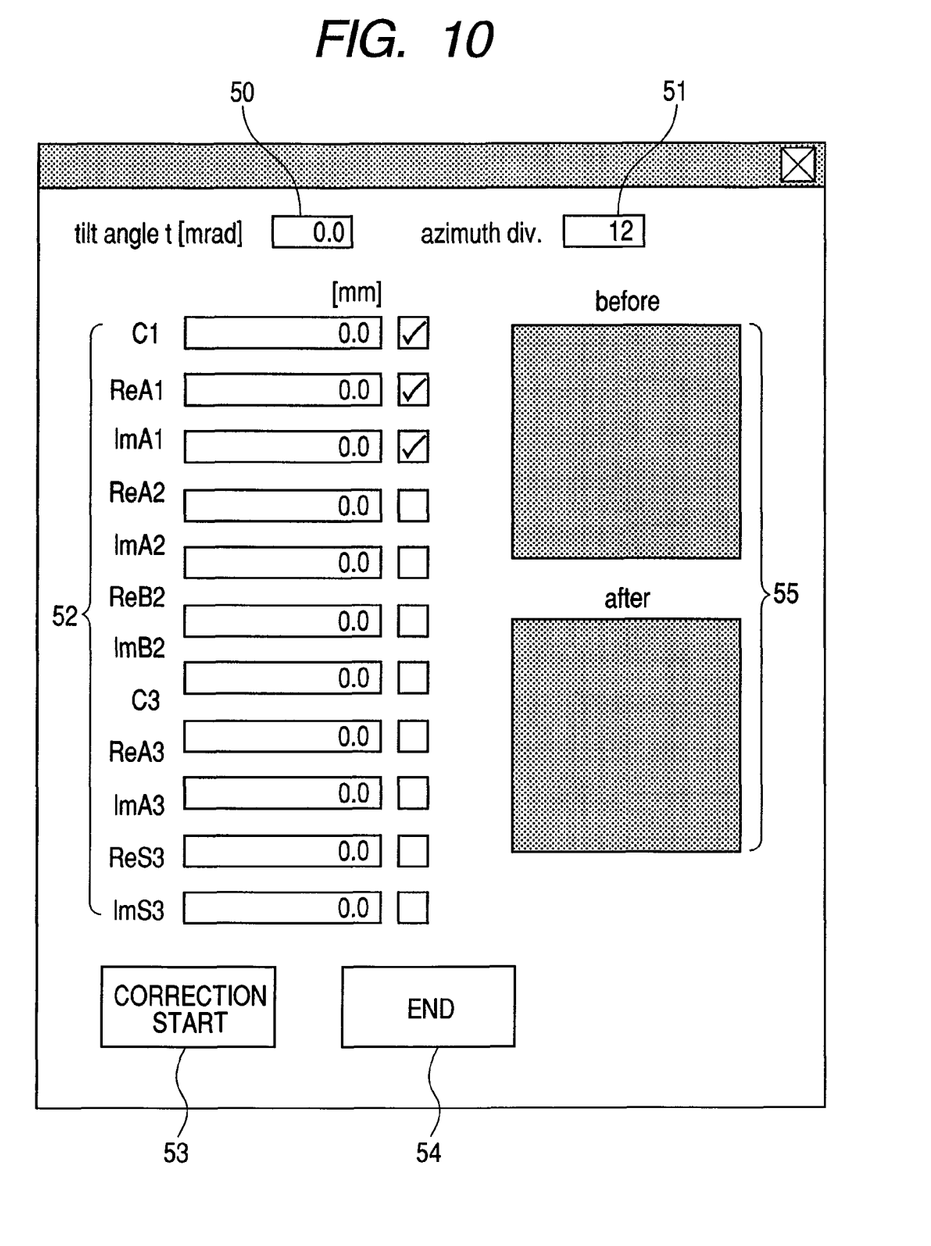
FIG. 10 is a drawing showing the interface screen for the device for the third embodiment.

The length-measurement SEM of this embodiment can set values for the tilt angle $\tau$ and range of azimuth angle 100 and its step size ((by using the GUI interface displayed on the image display device 12. If adjusting to correct the aberration manually, then the user can set the beam tilt and check results on this screen. The tilt angle $\tau$ is for example set by inputting the specified value in the tilt angle setting unit 50. The ((can be set by designating the number of images to capture per one cycle of tilt beam images on the azimuth angle setter unit 51. Moreover the type of aberration/aberration to be corrected can be specified by selecting the type of aberration displayed on the correction specifier unit 52. The computing unit 10 generates the form for $C1(\tau)$, $A1(\tau)$ shown in Formula 5, in a format containing the specified type of aberration coefficient, and uses it during the least squares fitting shown in step 19 of FIG. 6. This method calculates the desired aberration coefficient selected by the device user. The aberration coefficient calculated in this way appears on the result display unit 52. A correction process selector 54 sets the process for starting correction and ending correction. The correction results can be confirmed since the image display unit 55 shows specimen images from both before and after correcting the aberration/aberration.

Utilizing the electrostatic lens focusing of this embodiment allows moving the focus at high speed, measuring the defocus data and aberration quantity in a short time, and finding the aberration coefficients at high speed.

What is claimed is:

1. A charged particle beam apparatus comprising:
    a charged particle optical system to scan a primary charged particle beam on a specimen, detect secondary charged particles emitted from the specimen due to the scanning and output the detection results as a secondary charged particle signal;
    a control unit for controlling the charged particle optical system;
    a data processing device to process the secondary charged particle signal that was output and acquire two-dimensional distribution information on pixels matching the area scanned by the primary charged particle beam,
    wherein the charged particle optical system includes:
    an aberration corrector to reduce the aberration generated by the charged particle optical system; and
    a unit to guide the charged particle beam from the optical axis of the charged particle beam in a tilted state onto the specimen, and
    wherein the data processing device:
    calculates an out-of-focus amount and astigmatic difference in the charged particle optical system from multiple two-dimensional distribution information acquired by scanning the specimen with the primary charged particle beam in a tilted state and also while changing a degree of focus and,
    calculates an optical order aberration coefficient to use in the charged particle optical system, by utilizing the two-dimensional distribution information obtained from scanning the specimen in a state where the primary charged particle beam is not tilted, and the calculated out-of-focus amount and astigmatic difference.

2. The charged particle beam apparatus according to claim 1, wherein the data processing device calculates a correction quantity of the aberration corrector by utilizing the calculated optical order aberration coefficient.

3. The charged particle beam apparatus according to claim 1, comprising:
    a standard specimen utilized to acquire the two-dimensional distribution information for adjusting the aberration corrector,
    wherein the standard specimen contains multiple charged particle beam irradiation surfaces formed in a pattern or a structure for acquiring the two-dimensional distribution information, and
    wherein the multiple irradiation surfaces include a structure positioned continuously in a lateral direction and arrayed via steps in a height direction.

4. The charged particle beam apparatus according to claim 3, wherein the charged particle beam apparatus acquires the two-dimensional distribution information in a state where the scanning range of the primary charged particle beam was adjusted so as to include all the multiple irradiation surfaces positioned consecutively in the lateral direction.

5. The charged particle beam apparatus according to claim 4, wherein the data processing device extracts the two-dimensional distribution information corresponding to one of the multiple irradiation surfaces among all the multiple irradiation surfaces from the acquired two-dimensional distribution information, and calculates the out-of-focus amount and astigmatic difference based on the extracted two-dimensional distribution information.

6. The charged particle beam apparatus according to claim 3, wherein the data processing device includes a storage unit that stores a size of the steps, and calculates the out-of-focus amount by using the applicable stored step size information.

7. The charged particle beam apparatus according to claim 1,
    wherein the charged particle optical system contains a magnetic field objective lens including an electrostatic lens, and
    wherein the control unit for the charged particle optical system changes the degree of focus by adjusting the applicable electrostatic lens.

8. The charged particle beam apparatus according to claim 7, comprising a storage unit to store information relating to the range width of the focus adjustment.

9. The charged particle beam apparatus according to claim 1, comprising:
    a specimen stage to hold the specimen,
    wherein the specimen stage contains a drive mechanism utilizing a piezoelement for moving the specimen in the height direction, and
    wherein the applicable drive mechanism changes the degree of focus.

10. The charged particle beam apparatus according to claim 9, wherein the data processing device calculates the specimen position in the height direction based on the feed amount for the piezoelement, and calculates the out-of-focus amount by using the applicable position in the height direction.

11. The charged particle beam apparatus according to claim 9, comprising a storage unit to store information relating to a piezoelectric feed range.

12. The charged particle beam apparatus according to claim 1,
    wherein the data processing device calculates the out-of-focus amount and dual symmetrical aberration from the two-dimensional distribution information and, calculates the aberration coefficient by using the applicable calculated out-of-focus amount and dual symmetrical aberration.

* * * * *